(12) United States Patent
Yagi

(10) Patent No.: US 6,639,292 B2
(45) Date of Patent: Oct. 28, 2003

(54) UV LIGHT SENSING ELEMENT

(75) Inventor: Shigeru Yagi, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 23 days.

(21) Appl. No.: 10/093,422

(22) Filed: Mar. 11, 2002

(65) Prior Publication Data

US 2003/0094664 A1 May 22, 2003

(30) Foreign Application Priority Data

Nov. 22, 2001 (JP) ......................................... 2001-357058

(51) Int. Cl.$^7$ .................. H01L 31/0232; H01L 31/107; H01L 31/00; H01L 31/075
(52) U.S. Cl. ...................... 257/440; 257/290; 257/291; 257/444; 257/451
(58) Field of Search ...................... 257/12–15, 290–292, 257/79, 94, 96, 440, 444, 451; 250/372

(56) References Cited

U.S. PATENT DOCUMENTS

| | | | | |
|---|---|---|---|---|
| 4,910,570 A | * | 3/1990 | Popovic | 357/30 |
| 5,625,202 A | * | 4/1997 | Chai | 257/94 |
| 5,726,440 A | * | 3/1998 | Kalkhoran et al. | 250/214.1 |
| 5,912,500 A | * | 6/1999 | Costello et al. | 257/434 |
| 6,559,467 B2 | * | 5/2003 | Nikolaev et al. | 257/12 |
| 2003/0006424 A1 | * | 1/2003 | Nakamura et al. | 257/103 |

* cited by examiner

*Primary Examiner*—Eddie Lee
*Assistant Examiner*—Jesse A Fenty
(74) *Attorney, Agent, or Firm*—Oliff & Berridge, PLC

(57) ABSTRACT

A UV light sensing element has at least a first electrode and a sensor. The first electrode has a semiconductor containing at least one element selected from Al, Ga and In together with nitrogen or oxygen, and the sensor layer has a semiconductor containing at least one element selected from Al, Ga and In together with nitrogen. A longer wavelength end of an absorption spectrum for the first electrode is located at a position nearer to a shorter wavelength side than a longer wavelength end of an absorption spectrum for the sensor.

10 Claims, 1 Drawing Sheet

UV LIGHT SENSING ELEMENT

BACKGROUND OF THE INVENTION

1. Field of the Invention

The present invention relates to a UV light sensing element.

2. Description of the Related Art

In recent years the amount of UV light is increasing on the ground level due to the destruction of the ozone layer, which is a problem concerning the Earth's environment. The increase in UV light shorter than 330 nm is particularly eminent on the ground level due to the decrease of ozone in the ozone layer.

Such an increase causes a serious influence on the health of mankind exemplified by generation of skin cancers, increase of hyper-sensitiveness to light due to DNA damages, and accelerated aging by light. UV light having a wavelength shorter than 320 nm has very high energy, and is called UV-B. It easily destructs DNA and causes various disorders in the human skin. UV light having a wavelength longer than 320 nm is called UV-A, and induces spots, freckles, and wrinkles in the human skin. It is not desirable from a cosmetic viewpoint. Therefore, it is necessary to measure UV light in a very wide range.

The measurement of UV light has been generally conducted with a UV light sensor employing an ordinary UV light sensing element coupled with a band pass filter. The band pass filter controls the coefficient of light transmission ranging from UV light to visible light using multiple reflection based on multiply layered thin films. An ordinary band pass filter having a transmission area in a wavelength range shorter than 400 nm, which includes a part of UV light, is accompanied with another transmission area for secondary light from 400 nm to 800 nm. Therefore, duplicated use of the band pass filter with another band pass filter cutting visible light is necessary for selective detection of light in the UV range. In reality, however, a band pass filter that cuts the visible region cannot transmit UV light of the shorter wavelength region. Therefore, selective transmission of UV light by coupling of band pass filters only has been difficult. Even if it is implemented using a combination of multiple band pass filters, the constitution of UV light sensing element inevitably becomes too complex and large-sized.

The conventional UV light sensing element based on such band pass filters has a difficulty in accurate determination of UV light since it exhibits a large fluctuation in the transmission wavelength region depending on the incident angle of UV light. In addition, the conventional UV light sensing element has shown a high dependency on an incident angle of UV light (deviation of UV light intensity from the cosine rule for the incident angle against the light-receiving surface). For this reason, installment of a waveguide on the sensing surface is necessary so that the incident UV light can enter almost vertically into the light-receiving surface. However, this brings about a defect that the size of light sensing unit in the UV light sensing element becomes inevitably large. Further, the above method is associated with inaccurate determination of incident light that enters the light-receiving surface with a low angle. Therefore, the accuracy of the measurement deteriorates for light containing a large portion of scattered components such as sunlight.

When a UV light detective sensor is to be made using an ordinary UV light sensing element, installation of band pass filters and waveguides is necessary in order to detect UV light of necessary wavelength and diminish the dependency on the incident angle. As a result, such UV light detective sensor has a complex and large-sized composition accompanied with a high production cost. In addition, its light sensitivity is inferior since the incident light has to pass through band pass filters and waveguides beforehand. Furthermore, the UV light sensing element exhibits rather quick deterioration due to the aging of employed band pass filers by UV light.

SUMMARY OF THE INVENTION

Namely, the target of the present invention is to provide a UV light sensing element that may be assembled to a UV light detective sensor, which is able to detect UV light of desired wavelength stably without using a band pass filter or a waveguide, and has a simple constitution, small size, stable and superior accuracy, and high sensitivity to light with low dependency on an incident angle at a low cost of production.

The present invention provides a UV light sensing element having a first electrode and a sensor, wherein the first electrode includes a semiconductor containing at least one element selected from Al, Ga and In with nitrogen or oxygen, and the sensor includes a semiconductor containing at least one element selected from Al, Ga and In with nitrogen, and a longer wavelength end of an absorption spectrum for the first electrode is located nearer to a shorter wavelength side than a longer wavelength end of an absorption spectrum for the sensor.

The sensor may be a layer, preferably a thin film layer and the first electrode may also be a layer, preferably a thin film layer.

The sensor layer may contain at least one element selected from C, Si, Ge and Pb.

Alternatively, the sensor layer may contain at least one element selected from Be, Mg and Ca.

The above sensor layer may also contain hydrogen.

Further, the present invention presents a UV light sensing element having at least the first electrode layer and the sensor layer provided on a substrate in this order.

Further, the above UV light sensing element may contain a second electrode layer.

In the UV light sensing element, one surface of the first electrode layer not adjacent to the sensor layer or one surface of the substrate not adjacent to the first electrode layer may be used as a light-receiving surface.

In the UV light sensing element, alternatively, one surface of the sensor layer not adjacent to the first electrode layer or one surface of the second electrode layer not adjacent to the sensor layer may be used as a light-receiving surface.

BRIEF DESCRIPTION OF THE DRAWING

Preferred embodiments of the present invention will be described in detail based on the followings, wherein.

DETAILED DESCRIPTION OF THE PREFERRED EMBODIMENTS

Figure 1:
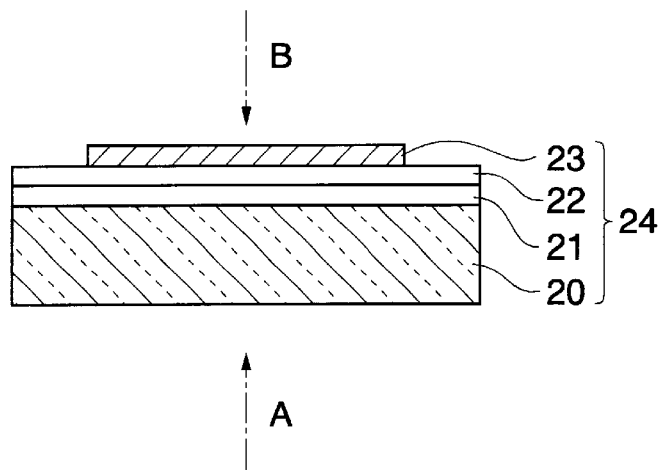
FIG. 1 is a schematic sectional view illustrating a preferred embodiment for the UV light sensing element according to the present invention.

Detailed descriptions of the present invention are given hereinafter in the following order:

Composition and physical characteristics of the first electrode layer and the sensor layer;

Thin film composition of the UV light sensing element and optical functions of each layered component;

Production method of the UV light sensing element and production apparatus; and

Measurement method of UV light employing the UV light sensing element.

[Composition and Physical Characteristics of First Electrode Layer and Sensor Layer]

The UV light sensing element according to the present invention is defined as a sensing element for UV light having at least a first electrode layer and a sensor layer wherein the first electrode layer includes a semiconductor containing at least one or more elements selected from Al, Ga, and In together with nitrogen and oxygen, the sensor layer includes a semiconductor containing at least one or more elements selected from Al, Ga, and In together with nitrogen, and the longer wavelength end of the absorption spectrum for the first electrode layer is located nearer to a shorter wavelength side than the longer wavelength end of the absorption spectrum for the sensor layer.

Meanwhile the "end of the absorption spectrum" is defined in general as a wavelength where light absorption coefficient drops drastically for the longer wavelengths, and a region on the side of the longer wavelengths in a continuous absorption spectrum of light, which derives from the electron transition from a valence band to a conductive band exemplified by the semiconductor employed in the sensor layer of the present invention.

However, the "end of the absorption spectrum" in the present invention is defined only as a wavelength where the light absorption coefficient drops drastically for the longer wavelengths. To be more accurate, it is defined as a value of wavelength where the light absorption coefficient decreases to 50% assuming the maximum absorption within a range between 190 nm and 400 nm is 100% (hereinafter the above relative ratio to the maximum absorption (%) is referred to the "absorption coefficient").

When a UV light detective sensor is assembled employing a UV light sensing element according to the present invention, the longer wavelength end of the absorption spectrum may be set up at will for the first electrode layer and the sensor layer so that UV light of a desired wavelength range may be detected without using a band pass filter.

For the reason, the UV light detective sensor employing a UV light sensing element according to the present invention exhibits very low dependency on the incident angle of light since a band pass filter is not needed. Further, it has excellent sensitivity to light, a simple constitution, small size, low production cost, good stability, and high accuracy, The longer wavelength end of the absorption spectrum for the first electrode layer must be located nearer to the shorter wavelength side than the longer wavelength end of the absorption spectrum for the sensor layer. In this case, the difference in wavelength between the longer wavelength end of the first electrode layer and the longer wavelength end of the sensor layer is preferably more than 1 nm, more preferably more than 10 nm.

With the difference less than 1 nm, the practicality of the UV light sensing element may be diminished since the amount of incident light into the sensor layer is decreased, assuming that one surface of the first electrode layer not adjacent to the sensor layer is the light-receiving surface.

The longer wavelength end of the absorption spectrum of the sensor layer is preferably between 190 nm and 420 nm, more preferably between 190 nm and 400 nm. Setting up the longer wavelength end of the absorption spectrum of the sensor layer within the above-specified range, the UV light sensing element becomes a practical tool for detecting UV light within a range exhibiting high needs for the measurement.

The longer wavelength end of the absorption spectrum both for the first electrode layer and the sensor layer may be controlled by changing the composition and/or the thickness of the thin films constituting them. The position of the longer wavelength absorption end of the first electrode layer may be freely controlled with the use of semiconductor thin films as in the sensor layer. An explanation on the preferred embodiments for the composition and the thickness of the semiconductor thin films will be given later.

The profile on the light absorption coefficient (may be abbreviated as "absorption coefficient profile" hereinafter) for the first electrode layer and the sensor layer in a wavelength region adjacent to the longer wavelength absorption ends for them has preferably an absorption coefficient of less than 40% at a position 50 nm longer than the longer wavelength absorption ends.

With the coefficient larger than 40% for the sensor layer at a position 50 nm longer than the longer wavelength absorption end, the light sensing element exhibits sensitivity, though slight, in a region far from the effective region for the UV light detection (a region between the longer wavelength end for the first electrode layer and the longer wavelength end for the sensor layer), and may detect light in the region as noise.

With the coefficient larger than 40% for the first electrode layer at a position 50 nm longer than the longer wavelength absorption end, the light sensing element may exhibit low sensitivity for the UV light since the difference in the absorption coefficients between the first electrode layer and the sensor layer becomes small in the effective region of the UV light detection.

Meanwhile the "light sensitivity" in the present invention is related with the conversion of UV light coming into the light-receiving surface to electric signals. It is defined as a ratio of the obtained variable intensity of electric signals (electric current or voltage) to the variable intensity of UV light having a specific wavelength or a specific region of wavelength upon the light-receiving surface.

The sensor layer having the above-defined longer wavelength absorption end and the absorption profile employs a thin film made of a nitride-based compound semiconductor having at least one or more elements selected from the IIIa group (Al, Ga, and In) together with nitrogen (abbreviated as nitride-based semiconductor). The composition and structure of the thin film is as follows.

The structure of nitride-based semiconductor may be either mono-crystalline or non-mono-crystalline. When the nitride-based semiconductor has non-crystals or micro crystals, it may contain a non-crystalline phase only, a micro-crystalline phase only, or a mixed phase of them.

The crystal form in these phases may be either cubic or hexagonal. It may be a mixture of multiple crystal forms. The particle size of the micro-crystal is preferably between 5 nm and 5 micrometer. The particle size may be determined by the X-ray diffractometry, the electron beam diffractometry, or the shape analysis of the crystal cross section using electron microscopic photographs.

The crystal structure of the thin film made of nitride-based semiconductor may be made up of a pillar form or a specific crystal form in which only a specific crystalline face or a specific crystalline axis has grown extraordinarily and is observed as a peak in the X-ray diffraction spectra. Or it may be made up of a mono-crystal.

The nitride-based semiconductor having non-mono-crystals may contain hydrogen. The hydrogen content is preferably between 0.5 atomic % and 50 atomic %. The nitride-based semiconductor having non-mono-crystals may contain halogens (F, Cl, Br, and I) instead of hydrogen.

When the hydrogen content is less than 0.5 atomic %, it becomes difficult to deactivate completely a defect level existing between the valence electron band and the conduction band. The deactivation depends on the elimination of bonding defects at the grain boundary and/or bonding defects and dissociated valence bonds within the non-crystalline phase using hydrogen (or halogens). Therefore, the thin film made of such nitride-based semiconductor exhibits a large amount of dark current and resultantly a considerably diminished light sensitivity due to the existence of many bonding defects and structural defects. For the reason, it may become difficult to produce a UV light sensing element of practical quality using the above thin film of nitride-based semiconductor for the sensor layer.

When the hydrogen content is larger than 50 atomic %, on the other hand, a two-dimensional bonding structure and/or a bonding structure of linear network is formed in the nitride-based semiconductor. This is because the three-dimensional structure produced by the IIIa group elements and nitrogen cannot be kept retained due to the increasing probability of hydrogen that reacts with the IIIa group elements in more than two bonds. In this case, a large amount of voids are generated at the grain boundary. As a result, a defect electron level is newly born between the valence electron band and the conduction band, leading to deterioration in the electric characteristics as well as in the mechanical properties such as hardness, etc. Since the thin film of nitride-based semiconductor is susceptible to oxidation, it may contain a large amount of impurity defects, which may inhibit excellent photoelectric conversion characteristics.

Furthermore, doping agents, which are added to the thin film of nitride-based semiconductor having non-crystals and micro-crystals for the control of electric characters, are deactivated by an excess amount of added hydrogen. For the reason excellent electric activities may not be obtained for the thin film of nitride-based semiconductor.

The absolute value of the hydrogen content may be determined by the hydrogen forward scattering (HFS) method. The relative value may be estimated by the measurement of released hydrogen at heating or by the absorption intensity of the IR spectra that is correlated with the bonding state of hydrogen. Further, the bonding state of hydrogen contained in the thin film of nitride-based semiconductor may be facilely investigated by the IR spectra.

In the present invention, a description such as ":H" in a chemical formula "GaN:H" means that the compound contains hydrogen within a range from 0.5 atomic % to 50 atomic % unless otherwise specified.

Concerning the composition of nitride-based semiconductor, it is preferable to satisfy a condition $0.5/1.0 \leq m/n \leq 1.01/0.5$, assuming that the number of atoms for the IIIa group element is m, and the number of nitrogen atom is n. When m/n is off the above range, a larger amount of bonding defects may be generated in the semiconductor due to the decreasing portion of tetrahedral bonding between the IIIa group element and nitrogen. This may block the satisfactory function of the nitride-based semiconductor.

The longer wavelength absorption end for the nitride-based semiconductor employed for the sensor layer is determined measuring the thin film thickness and the magnitude of the band gap for the nitride-based semiconductor. The thicker thin film thickness and/or the smaller band gap generally make the absorption end shift to the longer wavelength. The magnitude of the band gap may be varied at will by changing the mixing ratio of the IIIa group element. Thus a nitride-based semiconductor having a desired value for the longer wavelength absorption end may be easily obtained.

For a basic composition of GaN:H having a band gap of 3.2 to 3.5 eV (corresponding to the longer wavelength absorption end of about 420 nm to 300 nm), addition of Al makes the band gap shift between 3.5 and 6.5 eV (corresponding to the longer wavelength absorption end of 300 nm to 180 nm). Addition of Al and In to the basic composition makes the variable range of band gap further wider.

Meanwhile the longer wavelength absorption end values for the band gap listed in the example in parenthesis assume that the thin film thickness of the nitride-based semiconductor adopts figures of 0.05 micrometer to 2 micrometer, which are typical for a UV light sensing element.

With the typical thin film thickness, the nitride-based semiconductor having the longer wavelength absorption end in the UV area of short wavelength (180 nm to 320 nm) is preferred to have a composition AlxGa(1−x)N where $0.1 \leq x \leq 1.0$, more preferably $0.2 \leq x \leq 1.0$. When a nitride-based semiconductor having the longer wavelength absorption end in the UV area of longer wavelength (320 nm to 400 nm) is wanted, the composition is preferably AlyGa(1−y)N where $0 \leq y \leq 0.2$.

The nitride-based semiconductor thin film is a weak n-type semiconductor when it is not added impurities at all. In this state, it may be difficult to yield a sufficient light sensitivity (photo-conducting property or photoelectric motive force).

Therefore, the nitride-based semiconductor thin film may be further modified by adding a doping agent like an electron acceptor or an electron donor to make n-type or p-type semiconductor, or forming a shot-key barrier or a p-n junction. It may be modified to form a pin junction, which yields a light sensitivity much higher than the p-n junction.

At the formation of a p-n junction, the nitride-based semiconductor may have a structure including multiple thin films. Further, the above p-n junction may be formed not only in the sensor layer but also stretching over both the first electrode layer and the sensor layer, where a p-type semiconductor is formed on the first electrode layer and a n-type semiconductor is formed on the sensor layer.

The electron donors and/or electron acceptors listed below may be used for controlling the thin film of nitride-based semiconductor as an n-type semiconductor or a p-type semiconductor.

Examples of the electron donors for an n-type semiconductor include Li belonging to the Ia group (or the group 1 according to IUPAC, the 1989 revised edition for the naming method of inorganic substances), Cu, Ag, and Au belonging to the Ib group (or the group 11 according to IUPAC, the 1989 revised edition for the naming method of inorganic substances), Mg belonging to the IIa group (or the group 2 according to IUPAC, the 1989 revised edition for the naming method of inorganic substances), Zn belonging to the IIb group (or the group 12 according to IUPAC, the 1989 revised edition for the naming method of inorganic substances), and Si, Ge, Sn, and Pb belonging to the IVa group (or the group 16 according to IUPAC, the 1989 revised edition for the naming method of inorganic substances), and S, Se, and Te belonging to the VIa group.

Examples of the electron acceptors for a p-type semiconductor include Li, Na, K, belonging to the Ia group, Cu, Ag, and Au belonging to the IB group, Be, Mg, Ca, Sr, Ba, and Ra belonging to the IIa group, Zn, Cd, and Hg belonging to the IIb group, C, Si, Ge, Sn, and Pb belonging to the Iva group, S, Se, and Te belonging to the VIa group (or the group 16 according to IUPAC, the 1989 revised edition for the naming method of inorganic substances), Cr, Mo, and W belonging to the VIb group (or the group 6 according to IUPAC, the 1989 revised edition for the naming method of inorganic substances), Fe belonging to the VIII group (or the group 8 according to IUPAC, the 1989 revised edition for the naming method of inorganic substances), Co (the group 9 according to IUPAC, the 1989 revised edition for the naming method of inorganic substances), and Ni (the group 10 according to IUPAC, the 1989 revised edition for the naming method of inorganic substances).

Among these doping agents for the thin films of nitride-based semiconductor constituting the sensor layer, at least one or more elements selected from C, Si, Ge, and Pb are preferably added as the electron donor, preferably within a range between 1 atomic % and 10 atomic % to the above thin films of nitride-based semiconductor.

Meanwhile at least one or more elements selected from Be, Mg, and Ca are preferably added to the above thin films of nitride-based semiconductor, more preferably within a range between 1 atomic % and 10 atomic %.

The doping method of electron donors and/or electron acceptors into the thin films of nitride-based semiconductor is favorably carried out based on the known doping methods such as the thermal diffusion method or the ion injection method.

At the doping depending on the known doping methods, favorably employed as the material of doping agents are $SiH_4$, $Si_2H_6$, $GeH_4$, $GeF_4$, and $SnH_4$ as the electron donor, gases of $BeH_2$, $BeCl_2$, $BeCl_4$, dicyclopentadienyl-magnesium, dimethyl-calcium, dimethyl-strontium, dimethyl-zinc, and diethyl-zinc or their gasified products as the electron acceptor or the doping agent for yielding an i-type semiconductor.

The thickness of the sensor layer is preferably between 0.01 micrometer and 10 micrometer, more preferably between 0.05 micrometer and 5 micrometer. With the thin film thickness less than 0.01 micrometer, the amount of light absorbed by the sensor layer diminishes leading to the decreased light sensitivity.

With the thin film thickness larger than 10 micrometer, a lot of time may be needed for the thin film formation, or the longer wavelength absorption end is excessively shifted to the lower wavelength in proportion to the increased thin film thickness. Further, the light sensitivity may diminish because of the insufficient transport of the charge.

Then an explanation is given on the material to be used for the first electrode layer. The material is not limited in any manner as far as its longer wavelength absorption end satisfies the conditions specified by the present invention. But it is most preferably a nitride-based semiconductor containing the IIIa group elements (Al, Ga, and In) and nitrogen. Other preferable substances include, for example, Sn-doped $Ga_2O_3$, which is an oxide-based semiconductor having the IIIa group elements (Al, Ga, and In) and a doping agent. Meanwhile, the nitride-based semiconductor is particularly preferred to contain Al, Ga, and nitrogen. At the use of nitride-based semiconductor as an electrode, its electroconductivity is preferably much improved, preferably less than 1K $\Omega\square$ as the sheet resistance, more preferably less than 500 $\Omega\square$.

For this purpose, doping agents such as electron donors and/or electron acceptors may be used in the semiconductor usable for the first electrode layer as well as the semiconductor for the sensor layer. Especially preferred for the doping agent are one or more elements selected from C, Si, Ge, and Pb as the electron donor, and one or more elements selected from Be, Mg, and Ca as the electron acceptor. The doping method using these electron donors and/or electron acceptors may be carried out based on the aforementioned methods and materials.

When the first electrode layer is made up of a nitride-based semiconductor, it may be produced similar to the method described before in the production of the sensor layer. Note, however, that the longer wavelength absorption end for the first electrode layer must be located nearer to the shorter wavelength side than the longer wavelength absorption end for the sensor layer.

Therefore, when the semiconductor in the sensor layer has a composition $AlxGa(1-x)N$, and the semiconductor in the first electrode layer has a composition $AlyGa(1-y)N$, preferably $0 \leq y$ and $0.5 \leq x \leq 1.0$.

When the semiconductor in the sensor layer has a composition $GaxIn(1-x)N$, and the semiconductor in the first electrode layer has a composition $GayIn(1-y)N$, preferably $x < y$.

Further, when the semiconductor in the sensor layer has a composition $GaxIn(1-x)N$, and the semiconductor in the first electrode layer has a composition $GayIn(1-y)N$, preferably $0 \leq y$ and $0.5 \leq x \leq 1.0$.

Doping agents like an electron donor or an electron acceptor and/or hydrogen and halogens may be added to the first electrode layer having the nitride-based semiconductor that has the above-specified composition similar to the nitride-based semiconductor used in the sensor layer. However, the longer wavelength end of the absorption spectrum for the first electrode layer must be adjusted to locate nearer to a shorter wavelength side than the longer wavelength end of the absorption spectrum for the sensor layer.

The thin film thickness for the first electrode layer is preferably between 1 nm and 20 micrometer, more preferably between 5 nm and 10 micrometer. With the thin film thickness smaller than 1 nm, the formed electrode layer may not exhibit a sufficiently low electric resistance. With the thin film thickness larger than 20 micrometer, a lot of time may be needed for the formation of the thin film, and the longer wavelength absorption end for the first electrode layer may be excessively shifted to the longer wavelength in proportion to the increasing thin film thickness. Further, at the detection of UV light setting up one surface of the first electrode layer not adjacent to the sensor layer as the light-receiving surface, the intensity of UV light reaching the sensor layer may be diminished due to the excessive thickness, leading to inferior light sensitivity.

[Thin Film Constitution of UV Light Sensing Element and Optical Functions of Each Layer]

Next an explanation is given on the thin film constitution of the UV light sensing element according to the present invention. FIG. 1 illustrates a schematic cross-sectional view for a UV light sensing element according to the present invention, having a first electrode layer 21, a sensor layer 22, and a second electrode layer 23 formed on a substrate 20 in this order. Also, in a UV light sensing element 24 possessing the constitution in FIG. 1, a second electrode layer 23 may be omitted. However, the first electrode layer 21 and the sensor layer 22 are absolutely indispensable in the UV light sensing element according to the present invention. In the first case, the second electrode layer 23 may be substituted with a terminal installed on the light-receiving surface and/or the end face of the sensor layer 22 that is not in direct contact with the first electrode layer 21.

An explanation is made hereinafter on the optical function of the substrate 20, the first electrode layer 21, the sensor layer 22, and the second electrode layer 23 in a UV light sensing element, where one surface of the substrate 20 not adjacent to the first electrode layer 21 serves as the light-receiving surface (hereinafter, the surface will be referred to as light-receiving surface A, which receives light from the direction indicated by arrow A in FIG. 1). If the UV light sensing element 24 does not have the substrate 20, one surface of the first electrode layer 21 not adjacent to the sensor layer 22 serves as the light-receiving surface A.

The substrate 20 has preferably a light-transmitting property at least in the visible light region. It may work as a UV light filter that cuts the UV light of the shorter wavelength region. At this time, the UV light of the shorter wavelength is absorbed in the substrate 20, and does not reach the first electrode layer 21 as well as the sensor layer 22. The value of the longer wavelength absorption end for the substrate 20 is not limited as far as it locates in the UV light region. But it must be located at a wavelength shorter than the longer wavelength end of the absorption spectrum for the sensor layer 22, and is preferably at a position nearer to the shorter wavelength side than the longer wavelength end for the first electrode layer 21.

The light absorption value of the substrate 20 is preferably close to 0 in a wavelength region longer than the longer wavelength absorption end for the substrate 20. However, it is a requisite that the light absorption value is sufficiently small so that the UV light sensing element 24 exhibits sensitivity enough for a practical use at least in a wavelength region between the longer one of the two, namely the longer wavelength absorption end for the substrate 20 or the longer wavelength absorption end for the first electrode layer 21, and the longer wavelength absorption end for the sensor layer 22.

As is stated before, the longer wavelength absorption end for the first electrode layer 21 is located at a position nearer to the shorter wavelength side than that of the sensor layer 22. So a certain range of UV light passing through the first electrode layer 21 is absorbed in the sensor layer 22.

Meanwhile, the optical function for the second electrode layer is not particularly limited. But in the case where a secondary light sensing element is to be set up on one surface of the second electrode layer 23 facing to the sensor layer for the detection of light that has a wavelength range longer than that of the light detected at the sensor layer 22, for example, the second electrode layer 23 preferably has its longer wavelength absorption end at a position shorter than the wavelength range to be detected by the secondary light sensing element.

Next an explanation is given on the optical function of the substrate 20, the first electrode layer 21, the sensor layer 22, and the second electrode layer 23 in a UV light sensing element 24, in the case where one surface of the second electrode layer 23 not adjacent to the sensor layer 22 serves as the light-receiving surface (hereinafter, the surface will be referred to as light-receiving surface B, which receives light from the direction indicated by arrow B in FIG. 1). If the UV light sensing element 24 does not have the second electrode layer 23, one surface of the sensor layer 22 not adjacent to the first electrode layer 21 serves as the light-receiving surface B.

The position of the longer wavelength absorption end for the substrate 20 is not particularly limited. But when another light sensing element is to be set up on the opposite surface of the substrate 20 to the light-receiving surface B for the detection of light that comes in from the light-receiving surface B and passes through the substrate 20, the substrate 20 may be equipped with a role of cutting filter for a specific wavelength by setting up its longer wavelength absorption end at a position longer than the longer wavelength absorption end for the sensor layer 22.

The optical function for the first electrode layer 21 and the sensor layer 22 are not particularly limited, as is described before, as far as the longer wavelength absorption end for the former is located nearer to the shorter wavelength side than the longer wavelength absorption end for the latter. For the second electrode layer 23, it is a requisite that it allows transmission of at least a part of light in the UV region, and either its longer wavelength absorption end is located at a position nearer to the shorter wavelength side than the longer wavelength absorption end for the sensor layer 22, or it has a light transmission range at a position nearer to the shorter wavelength side than the longer wavelength absorption end for the sensor layer 22.

Meanwhile the UV light sensing element according to the present invention may use the light-receiving surface A only, or the light-receiving surface B only for the detection of UV light. It may use both. In this case, the longer wavelength absorption end for the second electrode layer 23 and the longer wavelength absorption end for the first electrode layer 21 have preferably different values. Setting up of the two longer wavelength absorption ends for the second electrode layer 23 and the first electrode layer 21 differently leads to presentation of a UV light sensing element that can detect UV light in two different regions employing the light-receiving surface A and the light-receiving surface B.

The substrate 20 must have an insulation property. But the crystallizing/amorphous property of the substrate is not particularly limited. For example, favorably employed are mono-crystalline substrate, poly-crystalline substrate, amorphous substrate, micro-crystalline substrate, or a combination of more than two phases.

Specific examples for the material of substrate 20 include inorganic materials such as glass, quartz, sapphire, MgO, LiF and $CaF_2$; and films or plates of organic plastics such as fluororesin, polyester, polycarbonate, polyethylene, polyethylene terephthalate and epoxy resin.

Especially when the detection of UV light coming into the light-receiving surface A is attempted, the substrate 20 has preferably a capability to transmit the visible light, and exhibits preferably its longer wavelength absorption end at a position nearer to the shorter wavelength side than the point of 320 nm. Examples of the substrate 20 having such capability are inorganic transparent substances such as quartz, sapphire, MgO, LiF, or $CaF_2$.

When the detection of UV light coming into the light-receiving surface B is attempted, on the other hand, the optical function of the substrate 20 is not particularly limited. It may employ, in addition to the above transparent substances, known substances such as silicone, organic resins listed above, metals including Al, Fe, Ni, stainless steel and Cu.

It is possible to form a mono-layer thin film or a multi-layer thin film as the second electrode layer 23 by the vapor deposition or the sputtering method using targets of metals and alloys of Al, Ni, Au, Co, Ag, or Pt. The metal thin film preferably has a thin form so that light can be transmitted through the thin film easily in the case where, when UV light is detected accepting the incident light from the light-receiving surface B, and/or when UV light is detected with a newly installed light sensing element that can detect light having a wavelength region lower than that of the light detected at the sensor layer 22 to accept the incident light coming into the light-receiving surface A and passing through the sensor layer 22.

Therefore, the metal thin film preferably has a thickness between 5 nm and 100 nm. With the thin film thickness less than 5 nm, the electric resistance may be excessively large due to the thinness. With the thin film thickness larger than 100 nm, the light transmission property is decreased, leading to a high production cost. Meanwhile, in addition to the metal thin films, transparent conductive materials such as ITO, zinc oxide, tin oxide, lead oxide, indium oxide, copper iodide, titanium oxide, and Sn-doped $Ga_2O_3$ may be used as well as metal oxide-based semiconductors for the second electrode layer 23.

Especially when UV light is detected accepting the incident light from the light-receiving surface A, metal thin film such as Al, Ni, Au, Co, Ag, Cu, Ti and Pt, and the above transparent conductive materials may be employed for the second electrode 23.

When UV light is detected accepting the incident light from the light-receiving surface B, on the other hand, all of the abovementioned materials may be usable. But metal thin films of Al, Ag, Au, Pt, and Ni are particularly preferable among them.

The UV light sensing element according to the present invention may be sealed in a case that protects the element optically, mechanically, or chemically. The case for the UV light sensing element according to the present invention may be made of metals, ceramics, glass, or plastics. When the UV light sensing element has the sensitivity to a wavelength region different from the necessary wavelength region, the case may work to block the unnecessary region.

In order to seal the UV light sensing element in a metal case, methods of welding, soldering, or adhesion may be employed. For the case of glass or plastics, the UV light sensing element may be fixed in the case using an adhesive. If the element is a plate, it may be laminated within the case.

If the plastic resin employed for the case is transparent to UV light, the UV light sensing element may be totally buried in the case with the light-receiving surface facing to the inside. Or the UV light sensing element may be installed in the case exposing its light-receiving surface. A vacant space may exist in the case or may not exist. The inside of the case may be filled with gases like nitrogen or argon, liquids like oil, or may be vacuumed.

When the case is equipped with a window for the light-receiving surface of the UV light sensing element, materials like glass, quartz, sapphire, or plastic resins and films made of polyethylene or polypropylene may be favorably employed.

[Production Method of UV Light Sensing Element and Production Apparatus]

Next an explanation is given on the thin films forming method for the nitride-based semiconductor, which is used for the first electrode layer and/or the sensor layer, and contains at least one or more elements selected from Al, Ga, and In together with nitrogen.

Figure 2:
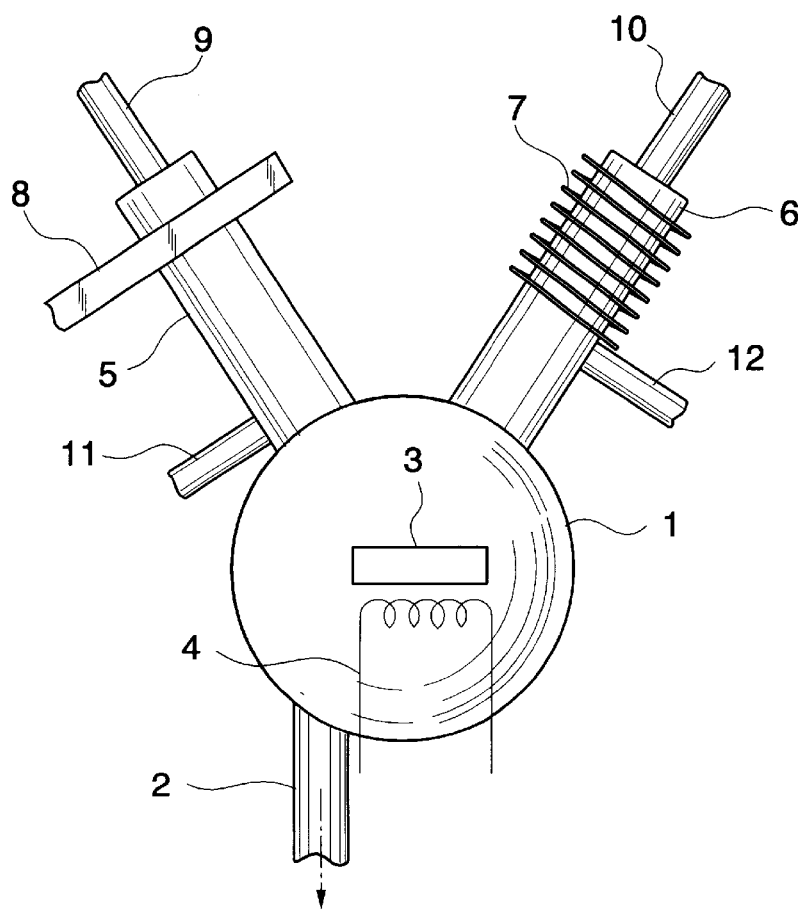
FIG. 2 is a schematic diagram illustrating a preferred embodiment for a thin film forming apparatus employed in the formation of a semiconductor thin film having the first electrode layer and the sensor layer of the UV light sensing element according to the present invention.

FIG. 2 illustrates a schematic diagram explaining a thin film forming apparatus, which is used for the production of semiconductor thin films constituting the first electrode layer and the sensor layer in the UV light sensing element according to the present invention. In the figure, 1 is a thin film forming room, 2 is an exit of exhaust gas, 3 is a holder of substrate, 4 is a heater for heating substrate, and 5 and 6 are quartz pipes connected to the thin film forming room 1 and then to gas-introducing pipes 9 and 10. The exit 2 of exhaust gas is connected to vacuum pumps (rotary pump and mechanical booster turbo pump) which are not shown in the figure. The quartz pipe 5 is connected to a gas-introducing pipe 11, and the quartz pipe 6 is connected to a gas-introducing pipe 12. A vacuum gage of the diaphragm-type (not shown in the figure) and a radiation thermometer (not shown in the figure) are installed inside the thin film forming room 1. The latter is installed facing the holder of substrate 3.

A high-frequency coil 7 is wound around the quartz pipe 6 and connected to a high frequency oscillator (not shown in the figure). All these constitute a plasma generator based on the inductive coupling. On other hand, the quartz pipe 6 is connected to micro waveguide 8 and then to a microwave oscillator (not shown in the figure). All these constitute an ECR-type plasma generator. Thus the thin film forming apparatus in FIG. 2 is actually an apparatus for plasma CVD (chemical vapor deposition), in which the above two plasma generators are both connected to the thin films forming room 1.

The thin films forming method of nitride-based semiconductor for the UV light sensing element according to the present invention is not limited to the configuration described in FIG. 2. For example, multiple thin film forming rooms may be equipped in an apparatus. Equipment other than CVD may be employed including PVD (physical vapor deposition) apparatus using the magnetron sputtering method.

Then an explanation is given on a preferred embodiment for the thin film formation of nitride-based semiconductor shown in FIG. 2.

Various species of gases are introduced for the electric discharge in order to produce a thin film of nitride-based semiconductor on the surface of a substrate installed on the holder of substrate 3 within vacuumed the thin film forming room 1. First, nitrogen gas is led into the quartz pipe 5 through the gas-introducing pipe 9 as the nitrogen source. A microwave of 2.45 GHz is fed into the micro waveguide 8 connected to a magnetron-based microwave oscillator (not shown in the figure) for the electric discharge in the quartz pipe 5. Then hydrogen gas, for example, is fed into the quartz pipe 6 via the gas-introducing pipe 10. A high frequency of 13.56 MHz generated by a high frequency oscillator (not shown in the figure) is fed to the high-frequency coil 7 for the electric discharge within the quartz pipe 6. Keeping this state, trimethyl-gallium gas is introduced to the gas-introducing pipe 12 via the thin film forming room 1, which has a space for the electric discharge. This results in the formation of non-crystalline or micro-crystalline thin film made of non-mono-crystalline nitride-based semiconductor on a substrate.

The thin film structure of the above photo-semiconductor (non-crystalline, micro-crystalline, polycrystalline with highly oriented toward a specific crystal axis or a crystal face and grown to a pillar, or mono-crystalline, etc.) may be controlled by the species of substrate, temperature at substrate, flow rate/pressure of gas, and electric discharging condition. The temperature of substrate is controlled between 100° C. and 600° C. With the temperature of substrate higher than 300° C., and/or with a smaller flow rate for a raw gas having IIIa group elements, the thin film is apt to take a form of micro-crystalline or mono-crystalline thin film. With the temperature of substrate lower than 300° C., and/or with a smaller flow rate for a raw gas having IIIa group elements, the thin film is apt to take a form of highly crystalline thin film.

With the temperature of substrate higher than 300° C., and/or with a larger flow rate for a raw gas having IIIa group elements, the thin film is apt to take a form of highly crystalline thin film. Further, when the thin film formation is attempted by adding activated plasma of hydrogen to a raw gas having the IIIa group elements, the thin film crystallinity is further improved.

Trimethyl gallium (TMGa) is usually employed as a raw gas of the IIIa group elements, but other organometallic compounds may be similarly employed in place of TMGa. They may be used in mixed form of more than two species. TMGa and the other organometallic compounds may be introduced simultaneously into the above system from the gas-introducing pipe 11.

When a species of gas containing at least one or more elements selected from C, SI, Ge, and Sn, or containing at least one or more elements selected from Be, Mg, Ca, Zn, and Sr is introduced into the discharging space within the thin film forming room 1 through the gas-introducing pipe 11 or 12, the thin film of nitride-based semiconductor may be formed on a substrate wherein the semiconductor may be donated of any conductive character at will such as p-type or n-type, and may have any crystalline state such as non-crystalline or micro-crystalline state. When carbon is selected, organometallic carbons may be used as a raw gas of the IIIa group elements depending on the condition of thin film formation.

In the above apparatus, the control of activated nitrogen or activated hydrogen formed by an electric discharging energy may be carried out separately, or a single compound like ammonia containing nitrogen atom and hydrogen atom simultaneously may be used for the purpose. Further, addition of hydrogen molecule to ammonia is also allowable. A specific condition may be adopted so that the activated hydrogen is dissociated from an organometallic compound. Under these conditions, a thin film of nitride-based semiconductor having non-crystalline or crystalline may be formed on a substrate wherein the activated IIIa group elements or nitrogen atoms exist in a specifically controlled state, and hydrogen atoms effect to convert methyl radical or ethyl radical into inactive molecules of methane or ethane, so that carbon atoms are not excessively taken into the thin film of nitride-based semiconductor. As the result, a thin film of nitride-based semiconductor having a suppressed amount of defects in the thin film is yielded.

The thin film forming apparatus in FIG. 2 may employ a publicly known plasma generation apparatus for the activation of hydrogen, nitrogen, and the IIIa group elements. It may be a high frequency oscillator, a microwave oscillator, or a high-frequency oscillator depending on the electron cyclotron resonance or helicon plasma. Either one or more than two of them may be used. A combination of two microwave oscillators or two high frequency oscillators may be usable. For the high-frequency discharge, the plasma generator may be an induction type or an inductance type. Two oscillators of the electron cyclotron resonance type may be used. When two different activation (excitation) methods are employed together, they must be adjusted to generate electric discharge simultaneously under the same pressure. Or a difference in the pressure may be set up between the discharging space and the thin film forming section. When the same pressure is applied to the two, it is quite effective for the control of thin film quality to adopt two different activation (excitation) methods, for example, microwave discharge and high frequency discharge, toward wide control of excitation energy needed for an excited species.

It is also possible to produce the thin films of nitride-based semiconductor in an atmosphere where at least hydrogen is activated with the methods of reactive vapor deposition, ion plating, or reactive sputtering.

Concerning the material for the semiconductor production in the present invention, organometallic compounds containing at least one element selected from Al, Ga, and In are favorably employed.

Examples of the organometallic compounds are trimethyl aluminum, triethyl aluminum, tertiary-butyl aluminum, trimethyl gallium, triethyl gallium, tertiary-butyl gallium, trimethyl indium, triethyl indium, and tertiary-butyl indium. They may be employed in single gaseous form gasifying liquid or solid, or in mixed form with a carrier gas bubbling into them. Examples of the carrier gas include hydrogen, nitrogen, hydrocarbons such as methane or ethane, halogenated hydrocarbons such as $CF_4$ or $C_2F_6$.

As the nitrogen source, gas or liquid of $N_2$, $NH_3$, $NF_3$, $N_2H_4$, or methyl hydrazine is favorably employed either gasifying them or making a carrier gas bubble into them.

To the thin films of nitride-based semiconductor formed by the aforementioned method and having the first electrode layer and/or the sensor layer, doping agents such as electron donors and/or electron acceptors may be further added based on the known methods such as heat diffusion method or ion injection. The first electrode layer and/or the sensor layer may be made up of a multiple layer thin film.

The thin film formation method of the second electrode layer 23 for the UV light sensing element shown in FIG. 1 is not particularly limited in any manner. For example it may be formed by making conductive metallic thin films using Au, etc., depending on the vacuum deposition. When UV light is detected based on the incident light coming into the light-receiving surface A or the light-receiving surface B, and/or when the detection is conducted with an additional light sensing element for the visible region, which is installed on the surface of the sensor layer 22 facing to the second electrode layer 23, for the detection of the incident light coming into the light-receiving surface A, the thin film forming method and the raw material are properly selected so that the light of desired wavelength region may transmit the thin films.

[Measurement of UV Light Using UV Light Sensing Element]

Signals coming out of the UV light sensing element 24 according to the present invention may be measured as a photocurrent between the first electrode layer 21 and the second electrode layer 23 at 0V bias. When an electric voltage is applied between the first electrode layer 21 and the second electrode layer 23, a photoelectric current may be also observed.

When the above signal measurement is carried out, the first electrode layer 21 and the second electrode layer 23 are wired using conductive adhesives, solders, or depending on wired-bonding, pressure welding, or pressure adhesion, and connected to an ammeter or a voltmeter.

White light from a xenon lamp is selected as a source of light in order to determine signals coming from the UV light sensing element 24 according to the present invention. It is converted to a monochromatic light employing a monochrometer (Product of NIKON, P250). The monochromatic light is irradiated on the quartz plate 20 (light-receiving surface A) inducing a photoelectric current, which may be measured as the signals.

The values of the longer wavelength absorption ends for the first electrode layer 21 and the sensor layer 22 are determined in the following way. First two kinds of samples are prepared at the time of making the UV light sensing element 24: only the first electrode layer 21 is formed on one substrate of quartz, and only the sensor layer 22 is formed on the other substrate under the same condition. Then the transmission spectra of the two samples are measured between 190 nm and 500 nm using an automatic spectrograph. The absorption spectra are converted from the transmission spectra, giving the longer wavelength absorption ends respectively.

DETAILED DESCRIPTION OF THE PREFERRED EMBODIMENTS

A detailed description of the present invention is given hereinafter with particularity, although the scope of the present invention is not limited to the following examples in any manner.

EXAMPLE 1

A cleansed substrate of quartz (thickness: 0.2 mm, length: 10 mm, width: 10 mm) was placed on the holder of the substrate 3. The thin film forming room 1 was evacuated to a back pressure of $10^{-3}$ Pa using a rotary pump and a mechanical booster pump connected to the exit of exhaust gas 2, and the substrate of quartz was heated to 500° C. by the heater 4.

Then nitrogen gas was introduced into the quartz pipe 5 having a diameter of 25 mm through the gas-introducing pipe 9 with a rate of 1,000 sccm (standard cubic centimeter per minute). A microwave of 2.45 GHz was fed through the waveguide 8 at an output of 250 W for the electric discharge taking matching with a tuner. At this time, the power of the reflected wave was 0 W. Note that a value of 1 sccm corresponds to a gas flow rate of 1 cm$^3$/min at 0° C. under a pressure of 1013.25 hPa (1 atm).

Then 500 sccm of hydrogen gas was introduced into the quartz pipe 6 having a diameter of 30 mm through the gas-introducing pipe 10. A high frequency of 13.56 MHz was applied setting the output at 100 W. At this time, the output of the reflected wave was 0 W.

Keeping this state, a vapor of trimethyl gallium (TMGa) in 0.2 sccm kept at 0° C. was introduced from the gas-introducing pipe 11 through a mass flow controller bubbling with hydrogen as the carrier gas at a pressure of $10^6$ Pa.

Further, trimethyl aluminum in 2 sccm, which was kept at 50° C. and nitrogen-bubbled at $10^6$ Pa, was introduced into the system through a mass flow controller using nitrogen as the carrier gas.

Then 10 sccm of silane gas diluted with hydrogen to 100 ppm was introduced into the reaction area from the gas-introducing pipe 12 through a mass flow controller. Here, the degree of vacuum was measured by a diaphragm-type vacuum gage (product of Ballatron Co., trade name: Ballatron). The reacting pressure in the thin film forming room 1 was 66.5 Pa (0.5 Torr). Keeping this state, the thin film formation was conducted on a substrate of quartz for 100 minutes, producing the first electrode layer having a 100-nm-thick film of Si-doped $Al_{0.8}Ga_{0.2}N{:}H$. Meanwhile the hydrogen content of the film determined by the IR (infrared spectrograph) was 5 atomic %.

Then the thin film forming room 1 was restored to ordinary pressure. The substrate of quartz formed of the first electrode layer was taken out from the thin film forming room 1, covered with a metallic mask on the first electrode layer, and again placed on the holder of substrate 3 with the surface having the first electrode layer up.

The system was evacuated to a back pressure of $10^{-3}$ Pa, and the substrate of quartz formed of the patterned first electrode layer was heated at 350° C. by the heater 4.

Then 1,000 sccm of nitrogen gas was introduced from the gas-introducing pipe 9 to the quartz pipe 5 having a diameter of 25 mm. A microwave of 2.45 GHz was fed for the electric discharge via the micro waveguide 8 setting the output at 250W and taking matching with a tuner. The power of the reflected wave was 0 W. Then 500 sccm of hydrogen were introduced from the gas-introducing pipe 10 to the quartz pipe 6 having a diameter of 30 mm. The output of high frequency of 13.56 MHz was set at 100W. The output for the reflected wave was 0 W.

Keeping this state, a vapor of trimethyl gallium (TMGa) in 0.5 sccm kept at 0° C. was introduced from the gas-introducing pipe 11 through a mass flow controller bubbling with hydrogen as the carrier gas at a pressure of $10^6$ Pa.

Then hydrogen gas of 5,000 Pa was introduced from the gas-introducing pipe 12 into dicyclopentadienyl magnesium kept at 20° C. for the bubbling, and the bubbled hydrogen gas in 1 sccm was introduced through a mass flow controller. The reaction pressure measured by a diaphragm vacuum gage was 66.5 Pa (0.5 Torr).

The thin film formation was conducted keeping this state for 30 minutes producing a 0.1-micrometer-thick Mg-doped GaN:H film for the sensor layer on the first electrode layer. Meanwhile, the hydrogen content of the film determined by the IR (infrared spectrograph) was 6 atomic %.

Then the thin film forming room 1 was restored to ordinary pressure. The substrate of quartz formed of the first electrode layer and the sensor layer successively was taken out from the thin film forming room 1, and covered with a metallic mask having holes of 3 mm on the sensor layer.

The substrate partly covering the sensor layer with a metallic mask was placed in a vacuum deposition room so that the masked surface of the substrate would face a deposition target (of Au with purity of 99.99%), and the vacuum deposition was carried out. Thus a 10-nm-thick film with a diameter of 3 mm was formed on the center of the sensor layer as the second electrode layer.

Finally a UV light sensing element for the example 1 was obtained, which included a-100-nm thick film of Si-doped $Al_{0.8}Ga_{0.2}N{:}H$ for the first electrode layer, a 0.1 micrometer thick film of Mg-doped GaN:H for the sensor layer, and a 10-nm-thick Au film with a diameter of 3 mm for the second electrode layer.

The first electrode layer and the second electrode layer of the UV light sensing element for the example 1 were bonded to silver wire of 0.1 mm using a conductive paste. The two silver wires were connected to a pico-ammeter (HP 4140B) for the measurement of signals generated by the incident light generated at the incidence of light into the UV light sensing element.

Next, the intensities of the signals were measured changing the angle of the light-receiving surface of the UV light sensing element relative to the out-coming light from a monochrometer. At this time the wavelength was fixed at 260 nm using a xenon lamp coupled with a monochrometer as the light source. The result showed that the output of 50% was obtained for the incident light coming into the light-receiving surface with an angle of 60 degrees, assuming that the output was 100% when the out-coming light came into the light-receiving surface vertically (angle of 0 degree). This is in good accord with the cosine rule.

Two kinds of samples were prepared for the measurement of the longer wavelength absorption end: only the first electrode layer was formed on the surface of one quartz substrate and only the sensor layer on the other. Light having a variable wavelength of 200 nm to 400 nm, which was generated from a xenon lamp coupled with a monochrometer, was applied on the substrate vertically. The absorption of UV light by the first electrode layer started around 250 nm, and reached 100% at about 200 nm showing its longer wavelength absorption end at 230 nm. Likewise, the absorption of UV light by the sensor layer started around 400 nm, and reached 100% at about 280 nm, showing its absorption end at 360 nm.

From these results it was confirmed that the UV light sensing element described in example 1 was able to detect UV light in a region from 220 nm to 400 nm showing low dependency on the incident angle, which proved excellent practicality of the element for the detection of UV light.

Further, when a UV light sensor is assembled using the UV light sensing element according to example 1, addition of band pass filters is not necessary since the element allows to detect UV light singly in a necessary and sufficient UV region. As the dependency on the incident angle is very small, the sensor does not necessitate installing a waveguide on the light-receiving surface in order to suppress the effect of the dependency. Therefore, when a UV light sensor is assembled using the UV light sensing element according to the example 1, the sensor is characterized by high light sensitivity, a simple constitution, small size, low production cost, good stability, and high accuracy.

EXAMPLE 2

The example 1 was repeated except that only trimethyl aluminum was introduced to the gas-introducing pipe 11 as the raw material of the IIIa group elements for the formation of the first electrode layer under the same conditions as in EXAMPLE 1.

On a substrate of quartz formed was the first electrode layer including Si-doped AlN:H film with a thickness of 100 nm. Meanwhile, the hydrogen content of the film determined by the IR (infrared spectrograph) was 5 atomic %.

Then the thin film forming room 1 was restored to ordinary pressure. The substrate of quartz formed of the first electrode layer was taken out from the thin film forming room 1, and covered with a metallic mask on one edge of the first electrode layer. It was again placed on the holder of substrate with the surface having the first electrode layer up.

The system was evacuated to a back pressure of $10^{-3}$ Pa, and the substrate of quartz formed of the patterned first electrode layer was heated to 350° C. by the heater 4.

Then 1,000 sccm of nitrogen gas was introduced from the gas-introducing pipe 9 to the quartz pipe 5 having a diameter of 25 mm. A microwave of 2.45 GHz was fed for the electric discharge via the waveguide 8 to set the output at 250W and take matching with a tuner. Here, the output of the reflected wave was 0 W. Then 500 sccm of hydrogen was introduced from the gas-introducing pipe 10 to the quartz pipe 6 having a diameter of 30 mm. The output of high frequency of 13.56 MHz was set at 100 W. The power for the reflected wave was 0 W.

Keeping this state, a vapor of trimethyl gallium (TMGa) in 0.5 sccm kept at 0° C. was introduced from the gas-introducing pipe 11 through a mass flow controller bubbling with hydrogen as the carrier gas at a pressure of $10^6$ Pa.

Further, trimethyl aluminum in 1 sccm, which was kept at 50° C. and hydrogen-bubbled by the gas-introducing pipe 11, was introduced into the system through a mass flow controller using hydrogen as the carrier gas.

Then hydrogen gas of 5,000 Pa was introduced from the gas-introducing pipe 12 into dicyclopentadienyl magnesium kept at 20° C. for the bubbling, and the bubbled hydrogen gas in 1 sccm was introduced through a mass flow controller. The reaction pressure measured by a diaphragm vacuum gage was 66.5 Pa (0.5 Torr).

The film formation was conducted for 30 minutes keeping this state, producing a 0.1-micrometer-thick Mg-doped $Al_{0.5}Ga_{0.5}N$:H film for the sensor layer on the first electrode layer. Meanwhile, the hydrogen content of the film determined by the IR (infrared spectrograph) was 6 atomic %.

Then the thin film forming room 1 was restored to ordinary pressure. The substrate of quartz formed of the first electrode layer and the sensor layer successively was taken out from the thin film forming room 1, and covered with a metallic mask having holes of 3 mm on the sensor layer.

The substrate partly covering the sensor layer with a metallic mask was placed in a vacuum deposition room so that the masked surface of the substrate would face a deposition target (of Au with purity of 99.99%), and the vacuum deposition was carried out. Thus a 10-nm-thick film of Au with a diameter of 3 mm was formed on the center of the sensor layer as the second electrode layer.

Finally a UV light sensing element for the example 2 was obtained, which included a 100-nm-thick film of Si-doped AlN:H for the first electrode layer, a 0.1 micrometer thick film of Mg-doped $Al_{0.5}Ga_{0.5}N$:H for the sensor layer, and a 10 nm thick Au film for the second electrode layer formed successively.

The first electrode layer and the second electrode layer of the above UV light sensing element for the example 2 were bonded to silver wire of 0.1 mm using a conductive paste. The two silver wires were connected to a pico-ammeter (HP 4140B) for the measurement of signals generated by the incident light at the incidence of light into the UV light sensing element.

Next, the intensities of the signals were measured while changing the angle of the light-receiving surface of the UV light sensing element relative to the out-coming light from a monochrometer. At this time the wavelength was fixed at 240 nm using a xenon lamp coupled with a monochrometer as the light source. The result showed that the output of 50% was obtained for the incident light coming into the light-receiving surface with an angle of 60 degrees, assuming that the output was 100% when the out-coming light came into the light-receiving surface vertically (angle of 0 degree). This is in good accord with the cosine rule.

Two kinds of samples for the example 2 were prepared for the measurement of the longer wavelength absorption end: only the first electrode layer was formed on the surface of one quartz substrate and only the sensor layer on the other. Similarly to the example 1, light having a variable wavelength of 200 nm to 400 nm, which was generated from a xenon lamp coupled with a monochrometer, was applied on the substrate vertically. The absorption of UV light by the first electrode layer started around 220 nm, and reached 100% at about 200 nm showing its longer wavelength absorption end at 210 nm. Likewise, the absorption of UV light by the sensor layer started around 300 nm, and reached 100% at about 220 nm, showing its absorption end at 250 nm.

From these results it was confirmed that the UV light sensing element described in example 2 was able to detect UV light in a region from 200 nm to 300 nm showing low dependency on the incident angle, which proved excellent practicality of the element for the detection of UV light.

Further, when a UV light sensor is assembled using the UV light sensing element according to example 2, addition of band pass filters is not necessary since the element allows to detect UV light singly in a necessary and sufficient UV region. As the dependency on the incident angle is very small, the sensor does not necessitate installing a waveguide on the light-receiving surface in order to suppress the effect of the dependency. Therefore, when a UV light sensor is assembled using the UV light sensing element according to the example 2, the sensor is characterized by high light sensitivity, a simple constitution, small size, low production cost, good stability, and high accuracy.

Comparative Example 1

The example 2 was repeated except that a 0.3-micrometer-thick ITO (indium-tin-oxide) film was formed on one surface of quartz substrate as the first electrode layer. A UV light sensing element for the comparative example 1 was thus produced.

Two kinds of samples for the comparative example 1 were prepared for the measurement of the longer wavelength absorption end: only the first electrode layer was formed on the surface of one quartz substrate and only the sensor layer on the other. Similarly to the example 1, light having a variable wavelength of 200 nm to 400 nm, which was generated from a xenon lamp coupled with a monochrometer, was applied on the substrate vertically. The absorption of UV light by the first electrode layer started around 340 nm, and reached 100% at about 280 nm showing its longer wavelength absorption end at 320 nm. Likewise, the absorption of UV light by the sensor layer started around 300 nm, and reached 100% at about 220 nm, showing its absorption end at 250 nm.

The first electrode layer and the second electrode layer of the above UV light sensing element for the comparative example 1 were bonded to silver wire of 0.1 mm using a conductive paste. The two silver wires were connected to a pico-ammeter (HP 4140B) for the measurement of signals generated by the incident light at the incidence of light into the UV light sensing element.

Next, the intensities of the signals were measured while changing the angle of the light-receiving surface of the UV light sensing element relative to the out-coming light from a monochrometer. At this time, the wavelength was fixed at 290 nm using a xenon lamp coupled with a monochrometer as the light source. The result showed, however, that the signal output for the UV light sensing element of the comparative example 1 was about one-tenth that of the example 2 for the incident light coming into the light-receiving surface vertically.

Compared with the UV light sensing elements in the examples 1 and 2, the UV light sensing element in the comparative example 1 barely managed to detect weak UV light with its sensor layer of low absorption efficiency in a region of 280 nm to 300 nm coming out of the first electrode layer. Therefore, the light sensitivity was about one-tenth that of the example 2. In addition, it was unable to detect UV light having a wavelength shorter than 280 nm, confirming its inferior activity for detecting UV light.

As have been described in detail, the present invention presents a UV light sensing element which, without a band pass filter or a waveguide, may be assembled to a UV light sensor characterized by easy detection of UV light in a desired range, low dependency on the incident angle, high sensitivity to light, a simple constitution, small size, low production cost, good stability, and high accuracy.

The entire disclosure of Japanese Patent Application No. 2001-357058 filed on Nov. 22, 2001 including specification, claims, drawings and abstract is incorporated herein by reference in its entirety.

What is claimed is:

1. A UV light sensing element comprising a first electrode and a sensor, the first electrode having a semiconductor containing at least one element selected from the group consisting of Al, Ga and In and one of nitrogen and oxygen, the sensor having a semiconductor containing at least one element selected from the group consisting of Al, Ga and In with nitrogen, wherein a longer wavelength end of an absorption spectrum for the first electrode is located nearer to a shorter wavelength side than a longer wavelength end of an absorption spectrum for the sensor.

2. The UV light sensing element according to claim 1, wherein at least one element selected from the group consisting of C, Si, Ge and Pb is added to the sensor.

3. The UV light sensing element according to claim 1, wherein at least one element selected from the group consisting of Be, Mg and Ca is added to the sensor.

4. The UV light sensing element according to claim 1, wherein the sensor further contains hydrogen.

5. The UV light sensing element according to claim 1 wherein the first electrode and the sensor are layered in this order on a surface of a substrate.

6. The UV light sensing element according to claim 5, further comprising a second electrode layered on the sensor.

7. The UV light sensing element according to claim 6, wherein one surface of the second electrode not adjacent to the sensor functions as a light-receiving surface.

8. The UV light sensing element according to claim 5, wherein one surface of the substrate not adjacent to the first electrode functions as a light-receiving surface.

9. The UV light sensing element according to claim 1, wherein one surface of the first electrode not adjacent to the sensor functions as a light-receiving surface.

10. The UV light sensing element according to claim 1, wherein one surface of the sensor not adjacent to the first electrode functions as a light-receiving surface.

* * * * *